(12) United States Patent
Tuttle et al.

(10) Patent No.: US 7,297,561 B2
(45) Date of Patent: Nov. 20, 2007

(54) PATTERN FOR IMPROVED VISUAL INSPECTION OF SEMICONDUCTOR DEVICES

(75) Inventors: Ralph C. Tuttle, Durham, NC (US); Christopher Sean Plunket, Apex, NC (US); David B. Slater, Jr., Raleigh, NC (US); Gerald H. Negley, Hillsborough, NC (US); Thomas P. Schneider, Apex, NC (US)

(73) Assignee: Cree, Inc., Durham, NC (US)

( * ) Notice: Subject to any disclaimer, the term of this patent is extended or adjusted under 35 U.S.C. 154(b) by 362 days.

(21) Appl. No.: 11/032,342

(22) Filed: Jan. 10, 2005

(65) Prior Publication Data

US 2005/0118738 A1    Jun. 2, 2005

Related U.S. Application Data

(62) Division of application No. 10/045,766, filed on Oct. 23, 2001, now Pat. No. 6,903,446.

(51) Int. Cl.
*H01L 21/66* (2006.01)
(52) U.S. Cl. ................... 438/14; 257/E21.705
(58) Field of Classification Search ............... 438/478, 438/184, 193, 195–198, 200–203, 206–207, 438/209–211, 218, 237, 165, 294, 308, 337, 438/353, 6, 10, 104, 107–114, 118, 121–123, 438/128–129, 135, 142, 145, 149, 151, 157, 438/176
See application file for complete search history.

(56) References Cited

U.S. PATENT DOCUMENTS 3,603,728 A    9/1971    Ariumua (Continued)

FOREIGN PATENT DOCUMENTS

EP    0 650 202 A1    4/1995

(Continued)

OTHER PUBLICATIONS

Peter Van Zant; "Microchip Fabrication: A Practical Guide to Semiconductor Processing;" 1997, McGraw-Hill, p. 100.

*Primary Examiner*—Michael Lebentritt
*Assistant Examiner*—Andre' Stevenson
(74) *Attorney, Agent, or Firm*—Summa, Allan & Addition, P.A.

(57) ABSTRACT

A semiconductor structure is disclosed that enhances quality control inspection of device. The structure includes a substrate having at least one planar face, a first metal layer on the planar face, and covering some, but not all of the planar face in a first predetermined geometric pattern, and a second metal layer on the planar face, and covering some, but not all of the planar face in a second geometric pattern that is different from the first geometric pattern. A quality control method for manufacturing a semiconductor device is also disclosed. The method includes the steps of placing a first metal layer on a semiconductor face of a device in a first predetermined geometric pattern, placing a second metal layer on the same face of the device as the first layer and in a second predetermined geometric pattern that is different from the first geometric pattern, and then inspecting the device to identify the presence or absence of one or both of the patterns on the face.

19 Claims, 4 Drawing Sheets

U.S. PATENT DOCUMENTS

| | | | |
|---|---|---|---|
| 3,795,973 A * | 3/1974 | Calhoun | 438/6 |
| 4,659,220 A | 4/1987 | Bronte et al. | |
| 4,778,745 A | 10/1988 | Leung | |
| 4,806,774 A | 2/1989 | Lin et al. | |
| 5,087,537 A * | 2/1992 | Conway et al. | 430/15 |
| 5,428,442 A | 6/1995 | Lin et al. | |
| 5,572,598 A | 11/1996 | Wihl et al. | |
| 5,637,186 A * | 6/1997 | Liu et al. | 438/14 |
| 5,699,282 A * | 12/1997 | Allen et al. | 702/85 |
| 5,811,223 A | 9/1998 | Bae | |
| 5,811,863 A | 9/1998 | Rostoker et al. | |
| 5,854,674 A | 12/1998 | Lin | |
| 5,869,395 A * | 2/1999 | Yim | 438/637 |
| 5,978,501 A | 11/1999 | Badger et al. | |
| 5,991,699 A | 11/1999 | Kulkarni et al. | |
| 6,001,663 A * | 12/1999 | Ling et al. | 438/17 |
| 6,021,380 A | 2/2000 | Fredriksen et al. | |
| 6,072,574 A | 6/2000 | Zeimantz | |
| 6,946,723 B2 * | 9/2005 | Satoh et al. | 257/669 |
| 7,179,661 B1 * | 2/2007 | Satya et al. | 438/11 |

FOREIGN PATENT DOCUMENTS

| | | |
|---|---|---|
| JP | 57034344 A | 2/1982 |
| JP | 57309550 A | 3/1982 |
| JP | 08111544 A | 4/1996 |

\* cited by examiner

PATTERN FOR IMPROVED VISUAL INSPECTION OF SEMICONDUCTOR DEVICES

CROSS-REFERENCE TO PRIOR APPLICATIONS

This application is a divisional of application Ser. No. 10/045,766 filed Oct. 23, 2001 now U.S. Pat. No. 6,903,446 entitled "Pattern for Improved Visual Inspection of Semiconductor Devices."

FIELD OF THE INVENTION

The present invention relates to the manufacturer of semiconductor devices. More particularly, the invention relates to quality control aspects in producing large numbers of devices on wafers and confirming that the devices have been properly made.

BACKGROUND OF THE INVENTION

The present invention relates to the manufacture of semiconductor devices. In particular, the invention relates to the manufacture of light-emitting diodes (LEDs) and related devices such as laser diodes formed in silicon carbide and related wide bandgap materials.

Silicon carbide is a preferred material for certain semiconductor devices, circuits and device precursors. Silicon carbide has a number of favorable physical and electronic properties that make its use attractive for devices in which relatively large bandgaps are desired or necessary. Because of its relatively wide bandgap and its greater recent availability in device quality crystals, wafers, substrates and epitaxial layers, silicon carbide has formed the foundation for a significant increase in the production, sale and use of LEDs that emit in the blue portion of the visible spectrum. Additionally, as other wide bandgap materials have more carefully adapted for light-emitting diode use, particularly the Group III nitrides, silicon carbide has proved to be an advantageous substrate material for Group III nitride-based light-emitting diodes.

One of the benefits of silicon carbide, in addition to its appropriate crystal structure match with many Group III nitrides, is the capability of silicon carbide to be conductively doped. Because silicon carbide can be conductively doped, a silicon carbide substrate can function as part of the current-carrying portion of a light-emitting diode. As a result, silicon carbide can form part of a "vertical" light-emitting diode; i.e., one in which the ohmic contacts are positioned on the top and bottom (i.e., opposite ends) of the device and thus direct the light-generating current to flow linearly through the device. As known to those familiar with other substrate materials (such as sapphire) which are not conductive, a vertical geometry device cannot be formed with an insulating or semi-insulating substrate. Instead, the respective ohmic contacts must be placed in a lateral relationship rather than a vertical one on the device. In most circumstances, the vertical orientation offers a number of advantages, including a proportionally smaller size, generally easier incorporation into circuits and packages, and resulting lower cost.

Given the desired function of a light-emitting diode, the structure of the device should enhance rather than hinder the light-emitting function. Furthermore, LEDs are often rated on the basis of light output (e.g. brightness in microWatts, μM) at a given current (e.g. milliamps, mA). Accordingly, when ohmic contacts are made to silicon carbide substrates, they are preferably added in a manner that minimizes the amount of the substrate that they cover in order to permit as much light as possible generated by the diode to be emitted through the substrate as well as in other directions.

Furthermore, in order to produce the ohmic contacts to silicon carbide, the preferred techniques and structures incorporate several layers of metal. For example, in the light emitting diodes and lasers just described, the backside (i.e., substrate) ohmic contact is often formed by depositing a first layer of nickel (Ni) and then overlaying the nickel layer with one or more additional layers that are (for example) selected combinations or alloys of titanium (Ti) and gold (Au), or titanium, platinum (Pt) and gold.

In LEDs available from the assignee of the present invention, the Ni and Ti/Au metallization layers are formed in a pattern resembling the letter "X" in order to minimize the surface area being covered. In other devices (e.g. power devices) large ohmic contacts can be advantageous, but in an LED it is desirable to avoid coating an entire side (front or back) with metal, because the ohmic metals absorb light and reduce the total light output, and thus the efficiency of the device.

As is quite familiar to those of ordinary skill in the semiconductor arts, commercial devices are often formed in large numbers on circular wafers of semiconductor materials. The term "wafer" is used herein in its usual sense to refer to an item that has a thickness that is small in comparison to essentially parallel large surface areas. The term "wafers" can include single crystal substrates, substrates with epilayers, or substrates carrying a large number of (usually identical) devices or circuits. In the discussions herein, the term wafer will usually refer to one carrying a large number of identical optoelectronic devices (usually LED's) formed from doped epilayers on a substrate, with respective ohmic contacts to each device.

After fabricating devices on a semiconductor wafer, the wafer is cut ("diced") into individual chips, each of which contains a single device. Before packaging, each wafer should be inspected to ensure that the proper metallization layers have been deposited on the back side of the chip. If either the Ni or Ti/Au layer is missing, a good ohmic connection to the semiconductor substrate cannot be made. Alternately, even if an ohmic contact is made, poorly-formed layers can raise long-term reliability issues.

Presently, such inspection of SiC-based LEDs is performed manually and requires significant time and specialized equipment. The inspection also adds an additional, separate, unintegrated step to the manufacturing process. As a result, the inspection process may be somewhat inefficient and inaccurate. Furthermore, because the inspection process is manual, it cannot be easily combined with other manufacturing steps in a manner that would increase the overall efficiency of the process.

Nevertheless, identifying defective devices at an early stage avoids more expensive failure later on. Stated differently, identifying and discarding defective LEDs at the wafer stage is much less expensive than going to the additional cost of producing a fully packaged device which incorporates the defects that should have been identified earlier. Accordingly, early identification of the absence of the appropriate metal layers on the backside of a silicon carbide substrate is important.

Furthermore, silicon carbide wafers are relatively expensive. Accordingly, even when they are broken, if they contain possible useful die, these need to be inspected and the individual die or devices incorporated in the manufacturing stream if at all possible. As known to those familiar with semiconductor manufacturing, increasing the percentage of high quality devices on a wafer or in a process is one of the most fundamental ways to increase profitability.

OBJECT AND SUMMARY OF THE INVENTION

Therefore, it is an object of the present invention to provide a device, and a method of inspecting the device, that enhances the quality control and efficiency of the manufacturing process.

The invention meets this object with a semiconductor structure that enhances quality control inspection of device. The structure includes a substrate having at least one planar face, a first metal layer on the planar face, and covering some, but not all of the planar face in a first predetermined geometric pattern, and a second metal layer on the planar face, and covering some, but not all of the planar face in a second geometric pattern that is different from the first geometric pattern.

In another aspect the invention is a quality control method for manufacturing a semiconductor device. The method includes the steps of placing a first metal layer on a semiconductor face of a device in a first predetermined geometric pattern, placing a second metal layer on the same face of the device as the first layer and in a second predetermined geometric pattern that is different from the first geometric pattern, and then inspecting the device to identify the presence or absence of one or both of the patterns on the face.

The foregoing and other objects and advantages of the invention and the manner in which the same are accomplished will become clearer based on the followed detailed description taken in conjunction with the accompanying drawings in which:

DETAILED DESCRIPTION

As noted herein, the invention relates particularly to light emitting diodes, ("LEDs"), but is also applicable to other semiconductor technologies. Exemplary devices include those available from Cree, Inc., Durham, N.C., the assignee of the present invention, and include the G-SiC Technology "Super Blue" and "Super Bright" LED's that incorporate Group III nitride active layers on silicon carbide substrates. Exemplary devices (and methods for producing them) are also described in commonly assigned U.S. Pat. Nos. 5,416, 342; 5,338,944; 5,604,135; 5,523,589; 5,592,501; 5,838, 706; 5,631,190; 5,912,477 and 5,739,554. Given the available background in these and other patents, the details of particular LED structures and manufacturing techniques will not be explicitly recited herein, it being understood that those of ordinary skill in this art can use these and other available resources to carry out the present invention without undue experimentation.

It will also be understood, however, that although the invention is described herein in terms of silicon carbide and Group III nitride devices, these are exemplary descriptions, and the invention is not limited to these particular semiconductors.

Figure 1:
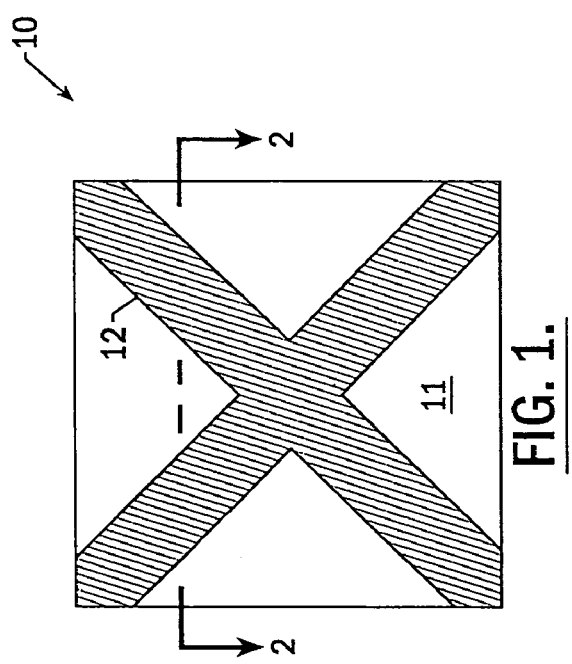
FIG. 1 is a bottom plan view of a conventional light-emitting diode.

In a first embodiment, the invention is a labeled semiconductor material. FIG. 1 is a bottom plan view of a conventional semiconductor device. The device is broadly designated at 10 and includes a surface 11. The surface 11 of the device 10 includes a conventional metal pattern 12 which as illustrated in FIG. 1 is in the form of a cross or the letter X. Patterns of this type can also be referred to as "cruciform," and either of these terms is appropriately descriptive of this particular pattern.

Figure 2:
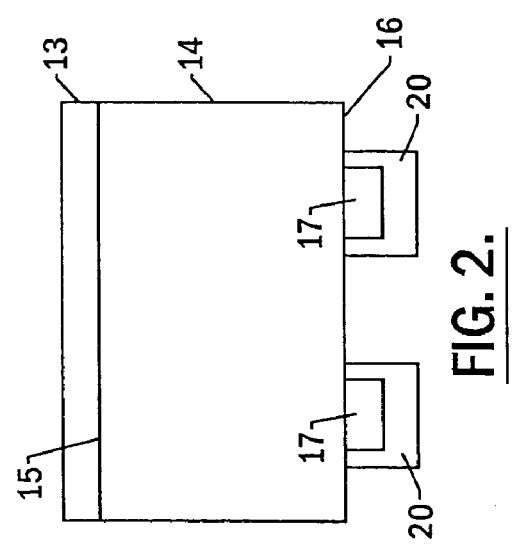
FIG. 2 is a cross-sectional view of the diode of FIG. 1 taken along lines 2-2.

FIG. 2 is a cross-sectional view taken along lines 2-2 of FIG. 1. FIG. 2 illustrates that devices of this type commonly include an epitaxial layer 13, and usually several epitaxial layers, two of which form a p-n junction. As known to those familiar with these devices, the injection of current (carriers) across the p-n junction drives the emission of the LED. In most devices, the epitaxial layer 13 is grown on a substrate 14, and particularly on the top surface 15 of the substrate 14, with one set of metal contacts being on the opposite surface 16 from the top surface 15 of the substrate 14.

Exemplary growth techniques for appropriate SiC substrates are set forth in U.S. Pat. No. 4,866,005 and its reissue RE34,861; and in U.S. Pat. No. 6,045,613.

FIG. 2 also illustrates that when the device is formed in silicon carbide, the metal layer 12 illustrated in FIG. 1 is preferably formed of a combination of metals. It will be understood that the choice of metals for an ohmic contact is dependent upon the nature of the semiconductor material and its doping. The theory and performance aspects of ohmic contacts are well-understood in the semiconductor arts. Exemplary discussions can be found in Sze, Physics of Semiconductor Devices, John Wiley & Sons, Inc. (1981) in Chapter 5, "Metal-Semiconductor Contacts" beginning on page 245. FIG. 2 illustrates that for semiconductor devices formed in silicon carbide such as those discussed with respect to the present invention, the ohmic contact is preferably formed of a first metal layer 17 which for silicon carbide is typically nickel, and a second metal layer 20, which for silicon carbide is typically formed of an alloy of titanium and gold or of titanium, platinum (Pt) and gold.

Exemplary techniques for obtaining ohmic contacts to silicon carbide, and resulting ohmic contact structures, are set forth in commonly assigned U.S. Pat. Nos. 5,323,02 and 5,409,859, as well as in several of the LED patents referred to earlier herein.

Figure 3:
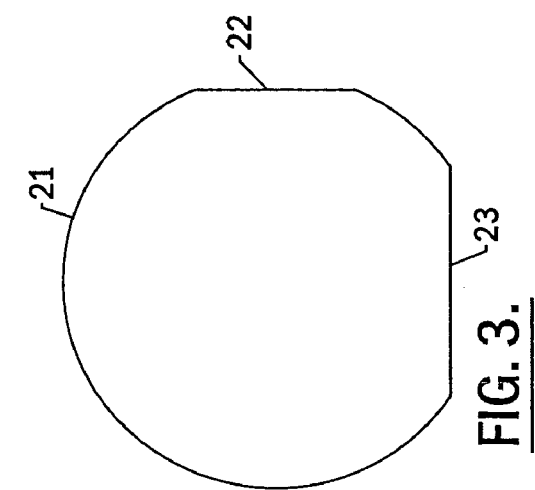
FIG. 3 is a top plan view of a semiconductor wafer with primary and secondary flats.

In order to further explain and illustrate the invention, FIG. 3 is a top plan view of a semiconductor wafer broadly designated at 21. The nature, manufacturing and handling of wafers is generally well understood in the semiconductor arts, and will not be described in detail herein other than as necessary to explain the invention. The wafer 21 is generally circular, but typically includes at least a primary flat 22 and preferably a secondary flat 23 as well. As known to those familiar with the handling of wafers, the primary and secondary flats 22, 23 allow the wafer to be positioned in a definitive alignment with respect to the devices on the wafer because the devices are formed on the wafer with a predetermined relationship to the primary and secondary flats 22, 23.

Figure 4:
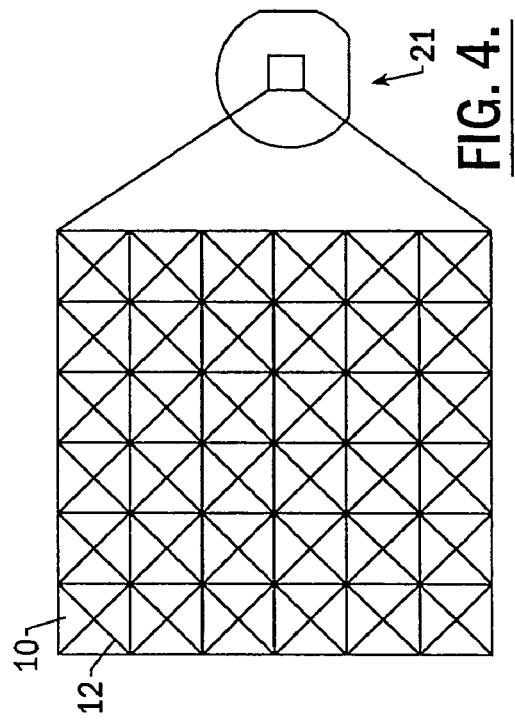
FIG. 4 is an enlarged view of a portion of the wafer of FIG. 3.

FIG. 4 is an enlarged portion of the wafer 21. It will be understood that the proportions shown in FIG. 4 are not necessarily to scale, but are generally illustrative of the construction of a typical semiconductor wafer. In particular, FIG. 4 illustrates that even a small portion of the wafer 21 carries a plurality of individual devices 10. In turn, the devices, which in most embodiments are identical to one another on any given wafer, include the metal layers 12 illustrated in FIGS. 1 and 2.

With FIGS. 1, 2, 3 and 4 as a general framework and background, FIGS. 5 through 11 illustrate specific features of the present invention.

Figure 5:
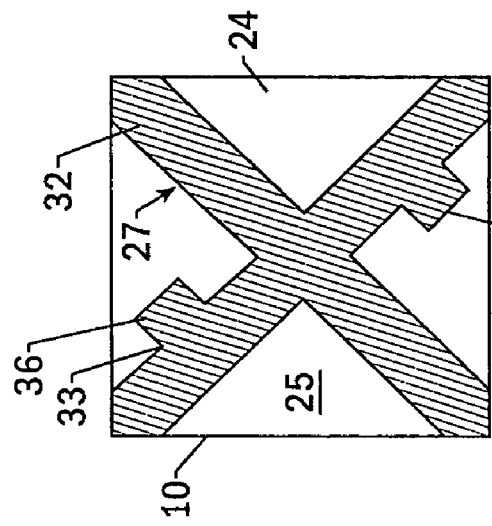
FIG. 5 is a bottom plan view of a semiconductor device according to the present invention.

Accordingly, FIG. 5 illustrates a labeled semiconductor material 24, which in preferred embodiments is a portion of a device 10, which in turn is one of many such devices 10 on a wafer 21. The semiconductor material 24 includes a surface portion 25 that carries a metal layer broadly designated as 26 on the surface 25. In particular, the first metal layer 26 is formed on portions, but not all of the surface 25 of the device 10. The metal layer 26 forms a pattern with rotational symmetry of Cn where n is at least 2. As noted previously, the metal layers 26 form an ohmic contact to the semiconductor material, and when the semi-conductor material comprises silicon carbide (as in preferred embodiments), the metal layer is typically selected from the group consisting of nickel, titanium, gold, platinum, vanadium, aluminum, alloys thereof, and layered combinations thereof.

As used herein, the rotational symmetry designation Cn is used in its usual and generally well understood mathematical sense; i.e., a pattern that is identical when rotated by a factor of 360 degrees divided by the integer n. Thus, when n is 2, rotating the pattern by 180 degrees will return or produce a pattern identical to the original. Accordingly, FIG. 5, when best understood, illustrates a first metal layer, which would correspond to the nickel layer 17 for example in FIG. 2, on the surface of the semiconductor material 24.

Figure 6:
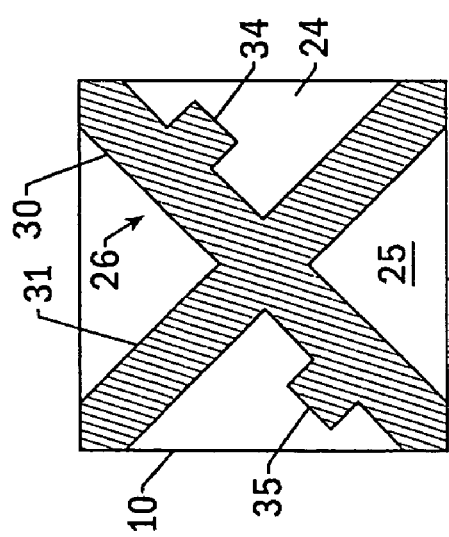
FIG. 6 is another bottom plan view of a semiconductor device according to the present invention.

FIG. 6 illustrates that in preferred embodiments, or alternatively in embodiments where 2 layers of metals are required or desired, the invention further includes a second metal layer 27 on portions but not all of the surface 25 of the semiconductor material 24 with the second metal layer 27 forming a pattern different from the first metal layer pattern 26, but with the second pattern 27 also having rotational symmetry of Cn where n is at least 2.

As will be discussed herein with respect to the method aspects of the invention, because of the C2 rotational symmetry, the patterns appear the same when viewed from the top or bottom of the device or substrate. As a result, the devices can be inspected from top or bottom as may be desirable or necessary in various circumstances.

Turning to FIGS. 5 and 6 in more detail, the first metal layer 26 is formed of two crossing stripes 30 and 31 and the second metal layer 27 is similarly formed of two stripes 32 and 33. With respect to the stripes, in order to provide the C2 symmetry for metal layer 26, stripe 30 includes a tab 34 and a tab 35, while the other stripe 31 that forms the metal layer 26 does not include any such tabs. Thus, the presence or absence of the metal layer 26 can be identified by the presence or absence of the tabs 34 and 35.

In a similar manner, in the second metal layer 27, the stripe 33 likewise includes the tabs 36 and 37. Thus, the presence or absence of the second metal layer 27 can be visually identified by the presence or absence of the tabs 36 and 37.

Figure 7:
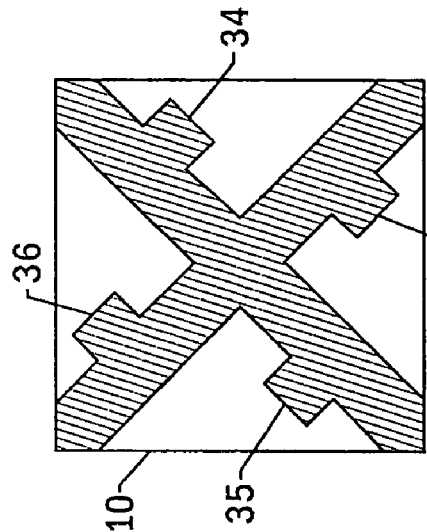
FIG. 7 is yet another bottom plan view of a semiconductor device according to the present invention.

In preferred embodiments, portions of layers 26 and 27 overlie one another to produce the overall pattern illustrated in FIG. 7. Because the metal layers and stripes overlie one another in FIG. 7, they are not labeled individually, but the individual tabs 34, 35, 36 and 37 are labeled in FIG. 7. It will be noted that when the metal layers 26 and 27 overlie one another, the resulting pattern has C4 symmetry, meaning that it can be rotated 90 degrees and still appear identical. As illustrated in FIGS. 5, 6 and 7, each of the first and second metal layers 26, 27 form an X or crossing pattern as described previously, and the tabs respectively 34, 35, 36 and 37 are each perpendicular to the respective stripes 30 and 33 to which they are attached. Other embodiments and patterns will be discussed herein, while yet other patterns are possible, even though not specifically discussed herein; for example, concentric circles could be used in the same manner as the crossing patterns with tabs that are illustrated in these Figures. It will thus be understood that the patterns for the metals illustrated herein are exemplary of the invention rather than limiting of it, and that any number of patterns can be chosen to have the appropriate symmetry, with symmetry being of importance for reasons discussed later herein. As noted earlier, however, the purpose of having the crossing patterns is to minimize the amount of metal on optoelectronic devices where the output of light is important, and the use of metal is minimized in order to maximize the light emitted from the device when the device is packaged and in use.

Figure 8:
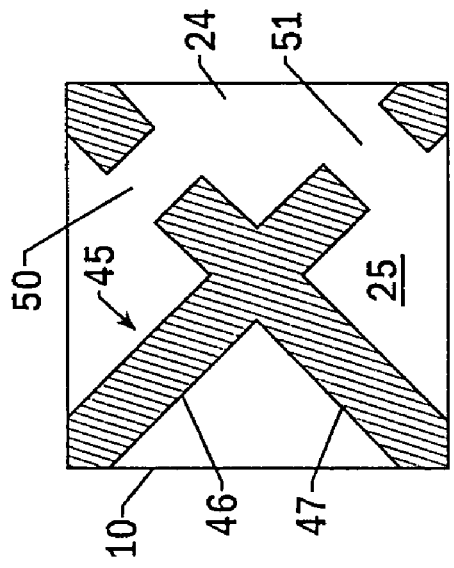
FIG. 8 is a bottom plan view of a different embodiment of a device according to the present invention.
Figure 9:
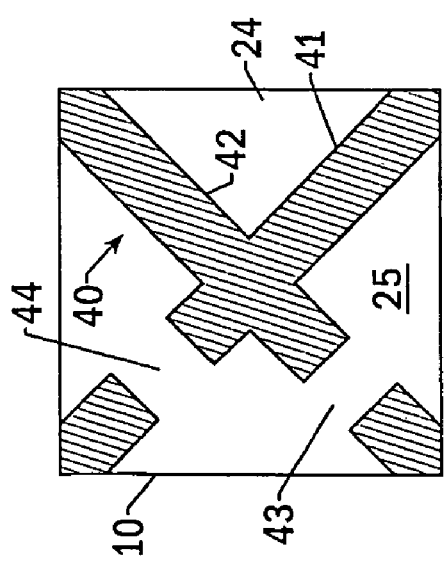
FIG. 9 is another bottom plan view of a semiconductor device according to the present invention.
Figure 10:
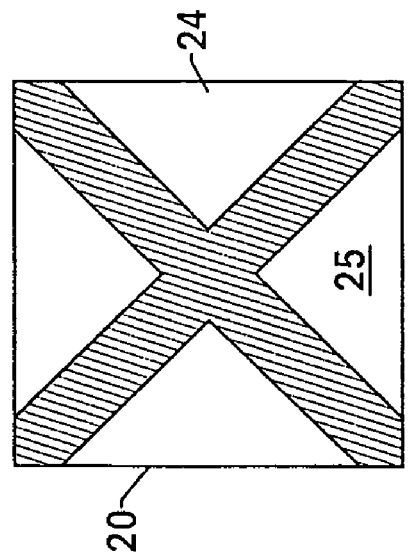
FIG. 10 is yet another bottom plan view of a semiconductor device according to the present invention.

FIGS. 8, 9 and 10 illustrate a second embodiment of the invention. In these Figures, the labeled semiconductor metal portions with a Cn pattern include linearly sequential plated and non-plated portions; i.e., blank portions in the stripes, rather than the tabbed portions illustrated in FIGS. 5, 6 and 7.

Accordingly, FIG. 8 illustrates another first metal layer 40, which is formed of crossing stripes 41 and 42. As in the previous embodiments, the stripes 41 and 42 are on the surface 25 of the semiconductor material 24. In this embodiment, the distinguishing features of the pattern are the non-metalized portions 43 and 44.

In a similar manner, FIG. 9 illustrates a second metal layer, generally designated at 45, which is formed of the respective stripes 46 and 47. In this second layer 45, the identifying portions of the patterns are the respective gaps 50 and 51 in the respective stripes 47 and 46.

FIG. 10 illustrates that when both of the metal layers 40 and 45 are properly in place there are no gaps in the crossing patterns, thus providing a visual confirmation that the first layer 40 and its overlying second layer 45 are properly in place.

The structure of the invention can be appropriately used with a number of different devices, including devices such as junction diodes, bipolar transistors, thyristors, MESFETs, JFETs, MOSFETs and photodetectors. As discussed earlier herein, the metal layers preferably form an ohmic contact to the device, and in the most preferred embodiments, the devices are formed of the respective substrate (e.g., 14 in FIG. 1) and epitaxial layer (e.g., 13 in FIG. 1), combined with other epitaxial layers formed of silicon carbide. When silicon carbide is the semiconductor substrate, the metal layers for the ohmic contacts are preferably selected from the group consisting of nickel, titanium, gold, alloys thereof and layered combinations thereof. In the most preferred embodiments, the devices 10 are light-emitting diodes or laser diodes that include a p-n junction and with the ohmic contact to the SiC substrate comprising a layer of nickel covered by a layer of titanium-gold alloy.

In a more preferred embodiment, the invention comprises a semiconductor wafer, such as the wafer illustrated at 21 in FIG. 3, with respective primary and secondary orthogonal flats 22, 23 and respective front and back planar faces. Each of the devices 10 on the wafer 21 have the first metal layer on one of the planar faces that cover some, but not all, of the planar face of each device in the first predetermined geometric pattern, and in preferred embodiments, each device has a second metal layer on the planar face and covering some, but not all, of the planar face of the device in a second geometric pattern that is different from the first geometric pattern. It will be understood that the patterns do not have to be entirely different from one another, but only sufficiently different for the identification purposes of the invention. In order to facilitate inspection, the devices 10 on the wafer 21 are aligned in a predetermined relationship with respect to the flaps.

In another aspect, the invention is a quality control method for manufacturing one or more semiconductor devices. The method comprises placing a first metal layer on a semiconductor face of a device; a wafer, an individual device, or even a device precursor; in a first predetermined geometric pattern, and then placing a second metal layer on the same face of the device as the first layer and in a second predetermined geometric pattern that is different, in some or all respects, from the first geometric pattern, with the patterns potentially overlying one another in portions.

In this aspect, the invention further comprises inspecting the device to identify the presence or absence of one or both of the patterns on the face. In preferred embodiments, the method also comprises discarding the device when one or both of the predetermined patterns are absent. As used herein, the term "discarding" is used in both a literal and figurative fashion, it being understood that in many cases the devices are marked with ink or otherwise identified rather than physically being removed from a wafer. In the most preferred embodiments, the method comprises inspecting the face of the device by illuminating the metallized face and scanning the metallized face with a machine inspection system. Furthermore, when the devices are sufficiently transparent, and the geometric patterns are symmetrical, the devices can be inspected by illuminating the face opposite from the metal layers and scanning the opposite face with a machine inspection system. In order to facilitate this, and as discussed with respect to the product aspects of the invention, in preferred embodiments, the method comprises placing a pattern with a rotational symmetry of Cn, where n is at least 2, and then the step of inspecting each device comprises inspecting either face of the device to identify the presence or absence of the Cn pattern.

In this regard, and although the invention is particularly suitable for metal patterns on transparent devices, it will be understood that if the substrate or device is opaque to frequencies within the visible spectrum, other frequencies (e.g. infra-red) can be used to illuminate the respective faces and identify the presence or absence of the characteristic patterns.

Figure 11:
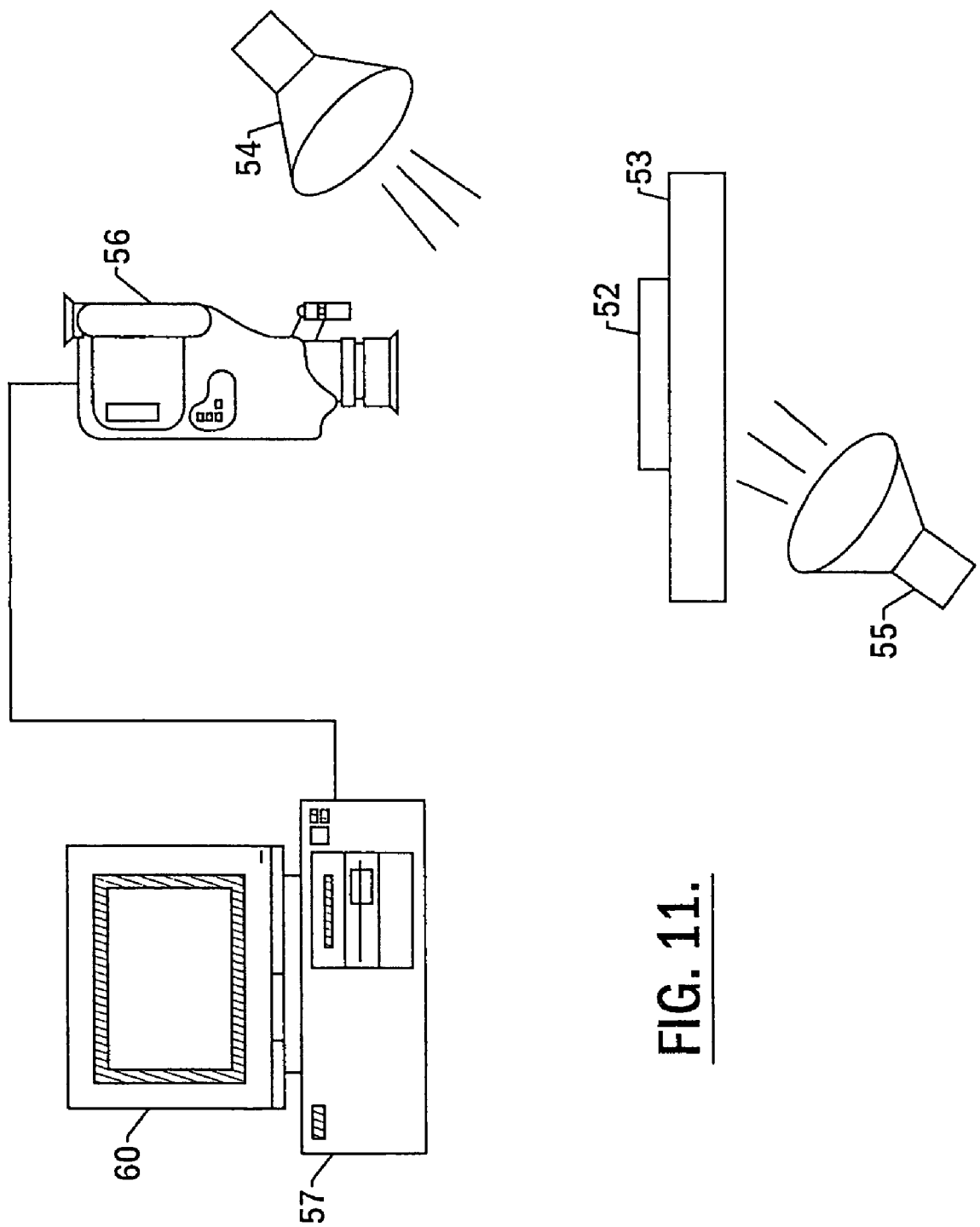
FIG. 11 is a schematic view of a system for inspecting wafers according to the present invention.

FIG. 11 illustrates some of the method aspects of the device. In FIG. 11, individual wafers (not shown) with the individual devices and metal layers are placed on a transparent wafer carrier 52, which, in turn, is carried on a transparent table 53. The wafers are then illuminated using either the front light source 54 or the back light source 55, and are inspected with a machine inspection system schematically illustrated by the camera 56. The nature and operation of machine inspection systems is well known in the semiconductor arts. An exemplary system is the NSX series of automated inspection equipment from August Technology Corporation, Bloomington, Minn. (USA). Such systems can detect defects as small as 0.5 micron (µ), can incorporate automated handling capabilities, and are used in conjunction with inspection software that can be configured to inspect a variety of devices, packages and wafers. The patent literature also provides a number of examples of inspection systems for semiconductor devices and wafers, and a number of such patents are cited concurrently herewith. As in most such systems, the signal from the camera or similar optical device 56 is forwarded to a processor 57, from which the information can be displayed or produced in a variety of formats, including information on a display monitor 60.

As set forth with respect to the product aspects of the invention, the use of wafers with at least one flat, and preferably both primary and secondary flats, enables the wafers to be predictably aligned on the wafer carrier 52, so that when the wafers are illuminated, the identifying patterns are in a predetermined and predicted relationship with respect to the machine inspection system (camera 56), so that the presence or absence of the distinguishing patterns can be immediately identified by the inspection system.

It will also be understood that although the invention offers these advantages for machine inspection systems, it offers similar advantages for manual inspection as well.

The invention has been described in detail, with reference to certain preferred embodiments, in order to enable the reader to practice the invention without undue experimentation. A person having ordinary skill in the art will readily recognize that many of the components and parameters may be varied or modified to a certain extent without departing from the scope and spirit of the invention. Furthermore, titles, headings, or the like are provided to enhance the reader's comprehension of this document and should not be read as limiting the scope of the present invention.

The invention claimed is:

1. A quality control method for manufacturing a semiconductor device comprising:
   placing a first metal layer on a semiconductor face of a device in a first predetermined pattern of rotational symmetry $C_n$, wherein n is an integer and $n \geq 2$; and
   placing a second metal layer on the same face of the device as the first layer and in a second predetermined geometric pattern that is different from the first pattern, the second geometric pattern having rotational symmetry $C_n$, where n is an integer and $n \geq 2$.

2. A quality control method according to claim 1 and further comprising:
   inspecting the device to identify the presence or absence of one or both of the patterns on the face.

3. A quality control method according to claim 2 and further comprising discarding the device when one or both of the predetermined patterns are absent.

4. A quality control method according to claim 2 wherein the step of inspecting the device comprises illuminating the metallized face and scanning the metallized face with a machine inspection system.

5. A quality control method according to claim 2 wherein the step of inspecting the device comprises inspecting a transparent device by illuminating the face opposite from the metal layers and scanning the opposite face with a machine inspection system.

6. A quality control method according to claim 2 wherein: the step of inspecting each device comprises inspecting either face of the device to identify the presence or absence of the $C_n$ pattern.

7. A quality control method for manufacturing wafers with a plurality of semiconductor devices thereon, the method comprising:
placing a first metal layer in a first predetermined geometric pattern on a semiconductor face of each device; and
placing a second metal layer on the same face of each device as said first layer and in a second predetermined geometric pattern that is different from said first geometric pattern;
inspecting the face of each device to identify the presence or absence of one or both of the patterns on each device; and
discarding the devices for which one or both of the patterns are absent.

8. A quality control method according to claim 7 wherein the step of inspecting the face of each device comprises evaluating each device with a machine inspection system.

9. A quality control method according to claim 7 wherein:
the steps of placing the metal layers comprises placing a pattern with rotational symmetry of $C_n$, where n is at least 2; and
the step of inspecting each device comprises inspecting either face of the device to identify the presence or absence of the $C_n$ pattern.

10. A quality control method according to claim 7 comprising forming the semiconductor devices on the wafer prior to the step of placing the first metal layer on the devices.

11. A quality control method according to claim 10 wherein the step of forming the semiconductor devices comprises forming at least one epitaxial layer on a substrate wafer.

12. A quality control method according to claim 11 comprising forming an epitaxial layer of silicon carbide on a silicon carbide substrate wafer.

13. A quality control method according to claim 12 comprising placing the metal layers on the face of the substrate opposite the epitaxial layer.

14. A quality control method according to claim 7 comprising:
placing the metal layers on a wafer that includes at least one flat; and
aligning the metal layers with the flat in a predetermined relationship.

15. A quality control method according to claim 14 wherein the step of inspecting the devices comprises aligning the flat of the wafer with a machine inspection system and thereafter evaluating each device with the machine inspection system.

16. A quality control method according to claim 8 wherein the step of inspecting the devices comprises inspecting a transparent device by illuminating the face of the wafer opposite from the metal layers and scanning the illuminated face with the machine inspection system.

17. A quality control method for manufacturing a semiconductor device having opposite faces on either side of the device, the method comprising:
placing a first metal layer on a first face of the device in a first predetermined pattern; and
placing a second metal layer on said first face of the device in a second predetermined geometric pattern that is different from the first pattern, wherein the first and second metal layers form a combined pattern with rotational symmetry of $C_n$, where n is an integer and $n \geq 2$; and
inspecting the device by illuminating (i) said first face of the device on which the metal patterns lie or (ii) the face of the device directly opposite the first face or both (i) and (ii).

18. A quality control method according to claim 17, wherein the step of illuminating the device comprises illuminating transparent layers of the device with light in the visible spectrum to identify the pattern.

19. A quality control method according to claim 17, wherein the step of illuminating the device comprises illuminating layers of the device with infrared light to identify the pattern.

* * * * *